United States Patent
Busekrus

(10) Patent No.: US 10,277,125 B1
(45) Date of Patent: Apr. 30, 2019

(54) WIDE RANGE POWER SUPPLY FOR USE IN METERS AND OTHER DEVICES

(71) Applicant: Landis+Gyr LLC, Lafayette, IN (US)

(72) Inventor: Douglas A. Busekrus, Lafayette, IN (US)

(73) Assignee: Landis+Gyr LLC, Lafayette, IN (US)

(*) Notice: Subject to any disclaimer, the term of this patent is extended or adjusted under 35 U.S.C. 154(b) by 0 days.

(21) Appl. No.: 15/845,868

(22) Filed: Dec. 18, 2017

(51) Int. Cl.
H02M 3/156 (2006.01)
H02M 7/06 (2006.01)
G01R 22/06 (2006.01)

(52) U.S. Cl.
CPC ............. *H02M 3/156* (2013.01); *H02M 7/06* (2013.01); *G01R 22/061* (2013.01)

(58) Field of Classification Search
CPC ........ H02M 3/156; H02M 7/06; G01R 22/061
See application file for complete search history.

(56) References Cited

U.S. PATENT DOCUMENTS

| | | | |
|---|---|---|---|
| 5,945,818 A | 8/1999 | Edwards | |
| 7,180,282 B2 | 2/2007 | Schleifer | |
| 2007/0217238 A1 | 9/2007 | Kanayama | |
| 2014/0312870 A1* | 10/2014 | Imayoshi | H02M 3/156 323/284 |

FOREIGN PATENT DOCUMENTS

| | | |
|---|---|---|
| EP | 2571152 | 3/2013 |
| JP | 2011078272 | 4/2011 |
| WO | 2011107976 | 9/2011 |

OTHER PUBLICATIONS

PCT/US2018/065370, "International Search Report and Written Opinion", Feb. 22, 2019, 12 pages.

* cited by examiner

*Primary Examiner* — Adolf D Berhane
*Assistant Examiner* — Afework S Demisse
(74) *Attorney, Agent, or Firm* — Kilpatrick Townsend & Stockton LLP

(57) ABSTRACT

A power conversion arrangement includes first and an optional second power conversion stages. The first stage has an input configured to receive an input voltage, an output having a first output voltage, a controller, a variable resistance, and a feedback node having a feedback voltage. The feedback node is coupled to the output by a first impedance. The controller receives the feedback voltage, and drives the output such that the feedback voltage is substantially at a predetermined value. The variable resistance is coupled between the feedback node and a reference voltage (e.g., ground). The variable resistance has a resistance value that varies as a function of the input voltage. The second stage has an input operably coupled to receive the first output voltage. The second stage is configured to generate an output voltage having a level that is substantially constant independent of the level of the first output voltage.

20 Claims, 4 Drawing Sheets

WIDE RANGE POWER SUPPLY FOR USE IN METERS AND OTHER DEVICES

FIELD OF THE INVENTION

This present invention relates to switched mode power supplies, and more specifically, to switched mode power supplies compatible with a wide range of input voltages.

BACKGROUND

Electrical utilities monitor the electrical energy consumption of customers through electricity meters. Modern electricity meters typically include solid state electronics components and associated electronic devices including sensor devices, data processors, microprocessors, memory devices, clocks, and communications devices. These electronic devices are used for various purposes within the electricity meter, including consumption detection, consumption calculation, data storage, and automatic meter reading (AMR) communications.

In association with these electronic devices, electricity meters also include power supplies configured to provide DC operating power. Typically, the power supply within the meter taps into the AC power line signals that are available within the meter, and converts the AC power line signals to one or more DC voltage levels for use by the meter's electronic devices.

Electricity is provided to customers (and hence to electricity meters) in a variety of voltage levels and service configurations. For example, the nominal voltage delivered to a load may vary from 120 Volts RMS to 480 Volts RMS. The electrical service can be single phase or multiphase, and multiphase services can be delta-wired, or wye-wired. Accordingly, meters must often be configured to accommodate the electrical service and voltage level to which they are connected. Ideally, a single meter may be used for all situations, so as to avoid logistical issues and to improve upon economies of scale. For example, it is more cost effective to build and sell identical meters for uses, than to build and sell multiple different versions of meters, each specific to one of the different electrical services.

However, a single universal meter is impractical for multiple reasons. Nevertheless, the same economies of scale can apply to parts and/or circuits within the meters. Thus, although different meter designs may be required for different electrical services, cost savings can be achieved if many of the same parts or circuits can be used in all or many of the designs. One example is the digital processing circuitry. Electricity meters typically include analog sensing devices that generate measurement signals, an A/D converter that converts the measurement signals to digital signals, and digital processing circuitry that performs the metering calculations using the digital signals. Because digital processing circuitry can be programmed to perform different metering calculations, the same digital processing circuitry can be used in meters for multiple different electrical services.

An area in which multiple designs can be necessary is the power supply. Because the meter power supplies obtain input power from AC power line signals, there is a potential that a different power supply can be necessary for each AC line voltage. To reduce the variety of power supply designs required for meters, it is known to use wide range switching power supplies in meters. By wide range, it is meant that the power supply is configured to receive a range of input voltages. In some cases, a single power supply design can be used for all service voltage levels.

U.S. Pat. No. 7,180,282 shows a wide range power supply that purports to accept input voltages in a range from 96 volts RMS to 528 volts RMS. Because it is not practical to use a switching transistor at such a range of voltages, U.S. Pat. No. 7,180,282 teaches a design that essentially stops the switcher from operating anytime the AC sinusoidal waveform is greater than the threshold. Such a design reduces the maximum available power that would otherwise be available. As a consequence, the power supply must be designed as if it were handling significantly higher power than it would otherwise need, negatively impacting cost, complexity, and size.

An alternative design is to employ power factor correction power supply, in a boost-buck configuration, to generate a low value unregulated DC voltage. One or more voltage regulators can then be used to generate regulated DC bias voltages for digital circuits, displays and the like. In this configuration, the front end circuit is a boost PFC converter that generates a high, but relatively constant, output voltage. A buck converter then reduces the voltage to about 12 volts of unregulated DC. This design does not require a large, high voltage transformer. However, it is not practical to operate the boost converter to a constant output voltage over the large range of input voltages in electricity meters, even excluding the very highest voltage levels of 480 volts RMS. For example, a boost converter that converts a 330 volt RMS input to a 500 volt output cannot efficiently convert a 40 volt RMS input to a 500 volt output. Accordingly, some current designs use two configurations of power supplies to cover potential input voltages ranges from 40 volts RMS to 330 volts RMS. Specifically, first design covers a range of input voltages from 40 volts RMS to 140 volts RMS, and the second design covers a range of input voltages from 85 volts RMS to 330 volts RMS. Such an arrangement, however, requires two different designs to be manufactured, stocked and properly installed in the appropriate meters.

There is a need, therefore, for a power supply that can be used over a wider range of input voltages that avoids some of the drawbacks of the prior art wide-range power supplies.

SUMMARY OF THE INVENTION

At least some embodiments of the invention address the above stated needs, as well as others, by providing a boost converter having a variable output voltage that varies as a function of input voltage. The output of the boost converter can be provided to a moderately wide range buck converter that generates a desired output voltage.

A first embodiment is power conversion arrangement that includes first and second power conversion stages. The first power conversion stage has a first input configured to receive an input voltage, an output having a first output voltage, a controller, a variable resistance, and a feedback node having a feedback voltage. The feedback node is coupled to the output by a first impedance. The controller is operably coupled to receive the feedback voltage, and is configured to drive the output such that the feedback voltage is substantially at a predetermined value. The variable resistance is coupled between the feedback node and a reference voltage (e.g., ground). The variable resistance has a resistance value that varies as a function of the input voltage. The second power conversion stage has a second stage input operably coupled to receive the first output voltage. The second power conversion stage is configured to generate a second output voltage having a voltage level that is substantially constant independent of a voltage level of the first output voltage.

In one embodiment, the first power conversion stage includes a boost converter, and the second power conversion stage includes a buck converter.

In another embodiment, a power converter includes a switched converter circuit, a feedback node having a feedback voltage, a first resistive branch, and a variable resistance. The switched converter circuit is operably coupled to receive an input voltage, and includes a semiconductor switch controlled by a controller. The controller is operably coupled to receive a feedback signal. The switched converter circuit is configured to provide an output voltage at an output. The first resistive branch is serially coupled between the output and the feedback node. The variable resistance is coupled between the feedback node and a reference voltage, such that the first resistive branch and the variable resistance form a voltage divider at the feedback node. The variable resistance has a resistance value that changes as a function of the input voltage.

The above-described features and advantages, as well as others, will become more readily apparent to those of ordinary skill in the art by reference to the following detailed description and accompanying drawings.

DETAILED DESCRIPTION

Figure 1:
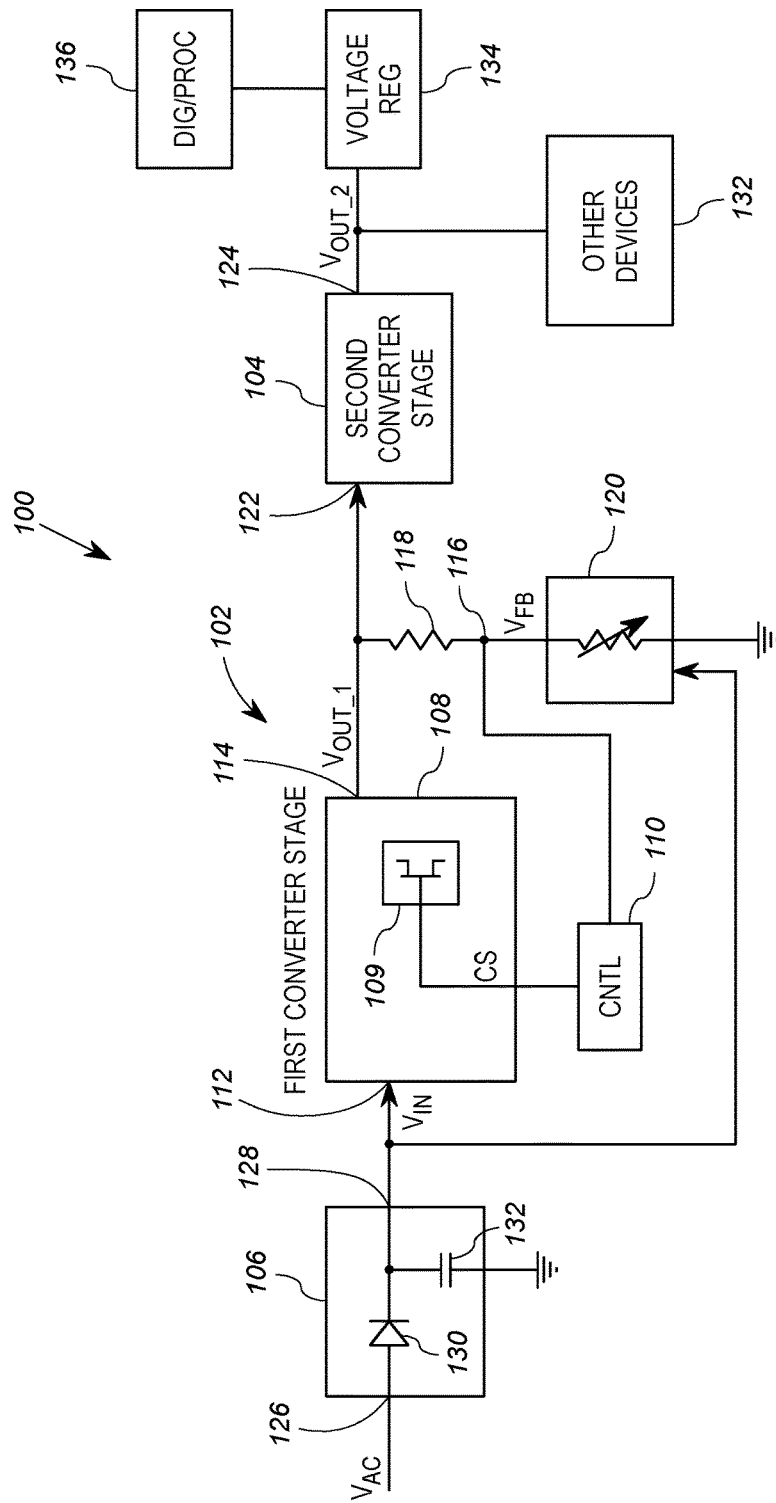
FIG. 1 shows a schematic block diagram of a first embodiment of a power conversion arrangement that incorporates a variable resistance in accordance with at least some principles of the present invention.

FIG. 1 shows a first embodiment of a power conversion arrangement 100 that incorporates at least some principles of the present invention. The power conversion arrangement 100 of FIG. 1 may readily be employed as a wide range power supply in an electricity meter, not shown, or other electronic device that could be coupled to any of a wide range of input AC voltages.

In this embodiment, the arrangement 100 includes a first power conversion stage 102, a second power conversion stage 104, and an optional rectifier circuit 106. The first power conversion stage 102 includes a switching converter 108, a controller 110, an input 112, an output 114, a feedback node 116, a first impedance 118 and a variable resistance 120. In this embodiment, the switching converter 108 is configured as a boost converter circuit, as will be discussed below in further detail. The second power conversion stage 104 has a second power stage input 122 and a second power stage output 124. In this embodiment the second power conversion stage 104 is configured as a buck converter that generates a substantially consistent unregulated DC output voltage at its output 124 responsive to a relatively wide range of input voltages received at the input 122. Such buck converters are known. For example, it is known to use voltage control of the switch of the buck converter to maintain a relatively consistent output voltage over a limited range of input voltages. A non-limiting example may suitably be based on the switching converter 408 and controller of 410 of FIG. 4, discussed below, without the variable resistance 420.

The rectifier circuit 106 has an input 126 and an output 128. In general, the rectifier circuit 106 is configured to receive an input AC voltage at its input 126, and generate a rectified signal at its output 128. In this embodiment, the rectifier circuit 106 is a half-wave rectifier including a diode 130 coupled in series between the input 126 and the output 128, and a capacitor 132 coupled between the output 128 and ground. It will be appreciated, that "ground" as used herein refers to circuit ground, and includes any other reference voltage to which voltages at the rest of the circuit are referenced. Moreover, the half-wave rectifier used as the rectifier circuit 106 is given by way of example only, and other rectifier circuits, including but not limited to a full-wave bridge rectifier, may also suitably be used.

The input 112 of the first converter stage 102 is operably coupled to receive an input voltage $V_{IN}$ from the output 128 of the rectifier circuit 106. Accordingly, in this embodiment, the input 112 is operably coupled to receive the rectified signal from the output 128. The switching converter 108 is configured to generate a first output voltage $V_{OUT\_1}$ at its output 114 from the input voltage $V_{IN}$. To this end, the switching converter 108 includes a semiconductor switch 109 controlled by the controller 110. The feedback node 116 is disposed serially between the first impedance 118 and the variable resistor 120. The first impedance 118, which in this embodiment is a resistor, is serially coupled from the output 114 to the feedback node 116. The variable resistor 120 is operably serially coupled between the feedback node 116 and ground. Accordingly, the feedback node 116 is the output of a voltage divider formed by the first impedance 118 and the variable resistance 120.

The controller 110 is operably coupled to receive the feedback voltage $V_F$ from the feedback node 116, and is configured to control the switch 109 to drive the output such that the feedback voltage $V_{FB}$ is driven toward a substantially constant at a predetermined value. The variable resistance 120 has a resistance value $R_V$ that varies as a function of the input voltage $V_{IN}$. Accordingly, it will be appreciated that because the voltage $V_{FB}$ maintained to be constant, a change in the input voltage $V_{IN}$ will change the output voltage $V_{OUT\_1}$ of the switching converter 108. In general, the variable resistance 120 in this embodiment is chosen to operate in a range that provides approximately half as much output voltage at the lowest input voltage $V_{IN}$ with the operating range as it does at the highest input voltage $V_{IN}$ within the operating range.

One purpose of the variable output voltage is to reduce the strain and efficiency losses in the first power conversion stage 102 that would otherwise be present if a constant output voltage were maintained over an entire operating range of input voltages, for example, from 40V to 330V, or even from 40V to 480V. For example, a constant output voltage of a boost converter with a 330V input voltage can reasonably be 500V DC, and still operate relatively efficiently. Using the same boost converter to generate a constant output voltage of 500V DC with an input of 40V requires approximately 12:1 gain, which is not practical nor efficient. In the arrangement 100 of FIG. 1, the variable resistance 120 may suitably be chosen to provide a low input voltage gain of no more than 6:1, thus providing an output voltage $V_{OUT\_1}$ of 240V at $V_{IN}$=40V, while still providing, for example, 500V, at the high end input voltage $V_{IN}$=330V.

In other words, the variable resistance 120 can be chosen to produce output voltages $V_{OUT\_1}$ at the low end of the input voltage $V_{IN}$ operating range that are 40% to 60% of the output voltages $V_{OUT\_1}$ at the high end of the input voltage $V_{IN}$ operating range. Thus, for an input operating range of $V_{IN}$ of $V_{IN\_MIN}$ to $V_{IN\_MAX}$, wherein $V_{IN\_MAX}-V_{IN\_MIN}=\delta_1$, the variable resistance 120 is chosen such that the corresponding output voltage $V_{OUT\_1}$ ranges from $V_{OUT\_MIN}$ to $V_{OUT\_MAX}$, wherein $V_{OUT\_MIN}$ to $V_{OUT\_MAX}$ is $\delta_2$, and $\delta_2 < \delta_1$.

Figure 2:
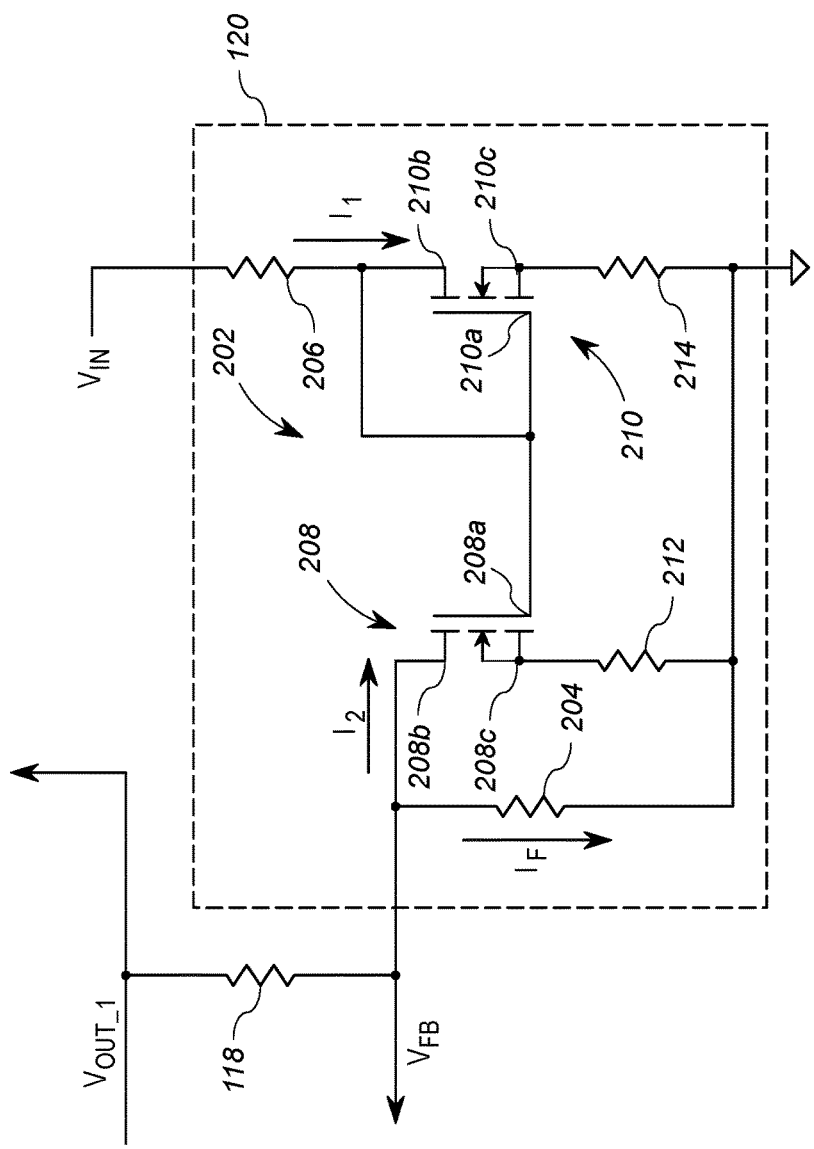
FIG. 2 shows a schematic block diagram of a portion of the power conversion arrangement of FIG. 1, including in further detail an exemplary embodiment of the variable resistance.

FIG. 2 shows an exemplary embodiment of a variable resistance 120 that may be used in the circuit of FIG. 1. The variable resistance in this embodiment includes a current mirror 202, a fixed resistor 204, and a sense impedance or sense resistor 206. The current mirror 202 is operably coupled between the feedback node 116 and ground, and is further operably coupled to the input 112 via the sense resistor 206. The current mirror 202 is configured to draw a current $I_2$ from the feedback node 116 that corresponds to a sense current $I_1$ generated through the sense impedance 206 by the input voltage $V_{IN}$. The fixed resistor 204 in this embodiment is a fixed resistor (i.e. not variable) coupled between the feedback node 116 and ground. As will be discussed below, the fixed resistor 204 operates to scale the impact of the $V_{IN}$ on the output voltage $V_{OUT\_1}$.

In this embodiment, the current mirror comprises a first FET 208, a second FET 210, a first resistor 212 and a second resistor 214. The first FET 208 includes a gate 208a and first and second output (e.g. drain and source) terminals 208b and 208c. The second FET 210 similarly includes a gate 210a and first and second output (e.g. drain and source) terminals 210b and 210c. The first output terminal 208b of the first FET 208 is operably coupled to receive the current $I_2$ from the feedback node 116, and the second output terminal 208c is operably coupled to provide the current $I_2$ to the first resistor 212. The second resistor 212 is further coupled to ground. The first output terminal 210b of the second FET 210 is operably coupled to receive the current $I_1$ from the sense resistor 206, and the second output terminal 210c is operably coupled to provide the current $I_1$ to the second resistor 214. The second resistor 214 is further coupled to ground. The gate 210a of the second FET 210 is directly coupled to both the first output terminal 210b, and the gate 208a of the first FET 208.

Referring again to FIG. 1, the input 122 of the second power conversion stage 104 is operably coupled to receive the output voltage $V_{OUT\_1}$ from the output 114 of the first power conversion stage 102. The second converter stage 104 is configured to generate a stable output voltage $V_{OUT\_2}$ at output 124 that is a predetermined voltage level over at least the range from $V_{OUT\_MIN}$ to $V_{OUT\_MAX}$. It will be noted that because $\delta_2$ is less than $\delta_1$, the second power conversion stage 102 can be within an ordinary operating range for a variable input switched mode power converter circuit. In this embodiment, the second power conversion stage 102 may be a variable input voltage buck converter configured to generate an output voltage $V_{OUT\_2}$ of approximately 12V DC, for an input range of 240V DC to 500V DC.

The output 124 of the second power conversion stage 104 is operably connected to provide the output voltage $V_{OUT\_2}$ to other devices 132 and/or one or more voltage regulators 134, which in turn may provide low voltage DC bias power to various digital/processing circuits 136. The digital/processing circuits may suitably be, for example, processing circuits of an electricity meter, which are known in the art.

In operation, the input 126 receives AC voltage $V_{AC}$ from a utility power source, not shown. Ideally, the AC voltage $V_{AC}$ is between 120 and 330V AC, but in some circumstances can be as low as 40V AC. The diode 130 and capacitor 132 operate as a half-wave rectifier to produce a rectified version of $V_{AC}$ at the output, which becomes the input voltage $V_{IN}$ to the first power conversion stage 102. Although $V_{IN}$ is rectified, it has a peak voltage (roughly 1.41 $V_{AC}$) that corresponds to $V_{AC}$.

The switching converter 108 generates at the output 114 the output voltage $V_{OUT\_1}$, based on the input voltage $V_{IN}$ and a control signal CS provided by the controller 110 to the switch 109. The voltage divider created by the first impedance 118 and the variable resistance 120 generates the feedback voltage $V_{FB}$ at the feedback node 116. The variable resistor 120 also receives in the input voltage $V_{IN}$. The variable resistor 120 has a resistance that is a function of the voltage level of $V_{IN}$.

The controller 110 operates to hold $V_{FB}$ constant. Specifically, the switching converter 108 controls the level of the output voltage $V_{OUT\_1}$ on the basis of the control signal CS provided by the controller 110. The controller 110, in turn generates the control signal CS as a function of the feedback voltage $V_{FB}$. As is known in the art, the controller 110 is configured to generate the control signal CS and provide the control signal to the switch 109 to drive the output $V_{OUT\_1}$ such that the feedback voltage $V_{FB}$ is relatively constant. To this end, the controller 110 generates a relatively high frequency switching signal (for example, a square wave signal), and varies the duty cycle to modulate the output voltage $V_{OUT\_1}$ (and hence $V_{FB}$) to drive $V_{FB}$ towards a predetermined set point.

When $V_{FB}$ is at the predetermined set point, the output voltage $V_{OUT\_1}$ depends on the value of the variable resistance $R_V$. Specifically, because the resistance $R_V$ of the variable resistance 120 can change, and because the feedback voltage $V_{FB}$ and the resistance $R_1$ of the first impedance 118 are constant, the output voltage $V_{OUT\_1}$ changes as a function of the variable resistance $V_R$.

The operation of the embodiment of the variable resistance 120 of FIG. 2 is now discussed in further detail. With reference to FIG. 2, the voltage $V_{IN}$ generates a current $I_1$ through the sense resistor 206 and the second resistor 214. That current $I_1$ is mirrored to $I_2$ by the operation of the current mirror 202. The current $I_2$ is drawn from the feedback node 116. The current $I_P$ is also drawn from the feedback node 116 through the fixed resistor 204. Both currents $I_P$ and $I_2$ are provided through the resistor 118. As a result, the current through the first impedance 118 is effectively $I_2 + I_P$. The output voltage $V_{OUT\_1}$ can thus be expressed as:

$$V_{OUT\_1} = V_{FB} + (I_2 \pm I_P) * R_1 \quad (1)$$

where $R_1$ is the resistance of the first impedance 118. Thus, as $V_{IN}$ increases, $I_1$ increases, which in turn causes $I_2$ to increase. As $I_2$ increases, $I_2 + I_P$ increases. As $I_2 + I_P$ increases, $V_{OUT\_1}$ will increase proportionally, as shown in equation (1), because the controller 110 is holding $V_{FB}$ constant. The value $R_S$ of the sense resistor 206 should be chosen such that the maximum of the input voltage range $V_{IN}$ produces the maximum desired output voltage $V_{OUT\_1}$.

Referring again to FIG. 1, as discussed above, the first power conversion stage 102 is a boost converter in this embodiment. In a non-limiting example, the variable resistor 120 can be designed such that at $V_{IN}=56V$ (peak), the low limit corresponding to $V_{AC}=40$, the output voltage is 280-330V, or such that the gain of the first power conversion stage is 5:1 or 6:1, and that at a high voltage level, such as $V_{IN}=466$, which corresponds to a high limit $V_{AC}=330$, the gain of the first converter stage is approximately 1.1:1, or about 500V. Such limits allow the duty cycle of the semiconductor switch 109 to remain within a reasonable range.

The input 122 of the second power conversion stage 104 receives the output signal $V_{OUT\_1}$, and generates an unregulated DC voltage $V_{UR}$ therefrom. Because the second power conversion stage 104 is a variable input power conversion circuit, for example, a buck converter, the unregulated DC voltage $V_{UR}$ remains constant regardless of whether $V_{OUT\_1}$, is at its lowest working voltage, e.g. 330V, or at its highest working voltage, e.g. 500V. It is noted that the second converter stage 104 is only required to handle input voltages through a range of 170 volts, as opposed to the operating range of the input voltage $V_{IN}$ of 410 volts. More importantly, the highest input voltage of the second converter stage 104 is less than twice the lowest input voltage, whereas the highest $V_{IN\_HIGH}$ in the example is over eight times the lowest $V_{IN\_LOW}$. Buck converters capable of handling an input range of voltages wherein the maximum is less than twice the minimum are well known in the art.

Accordingly, the above described embodiment allows for a wide input range power supply that does not drive either individual converter stage 102 or 104 into highly inefficient operating regions.

Figure 3:
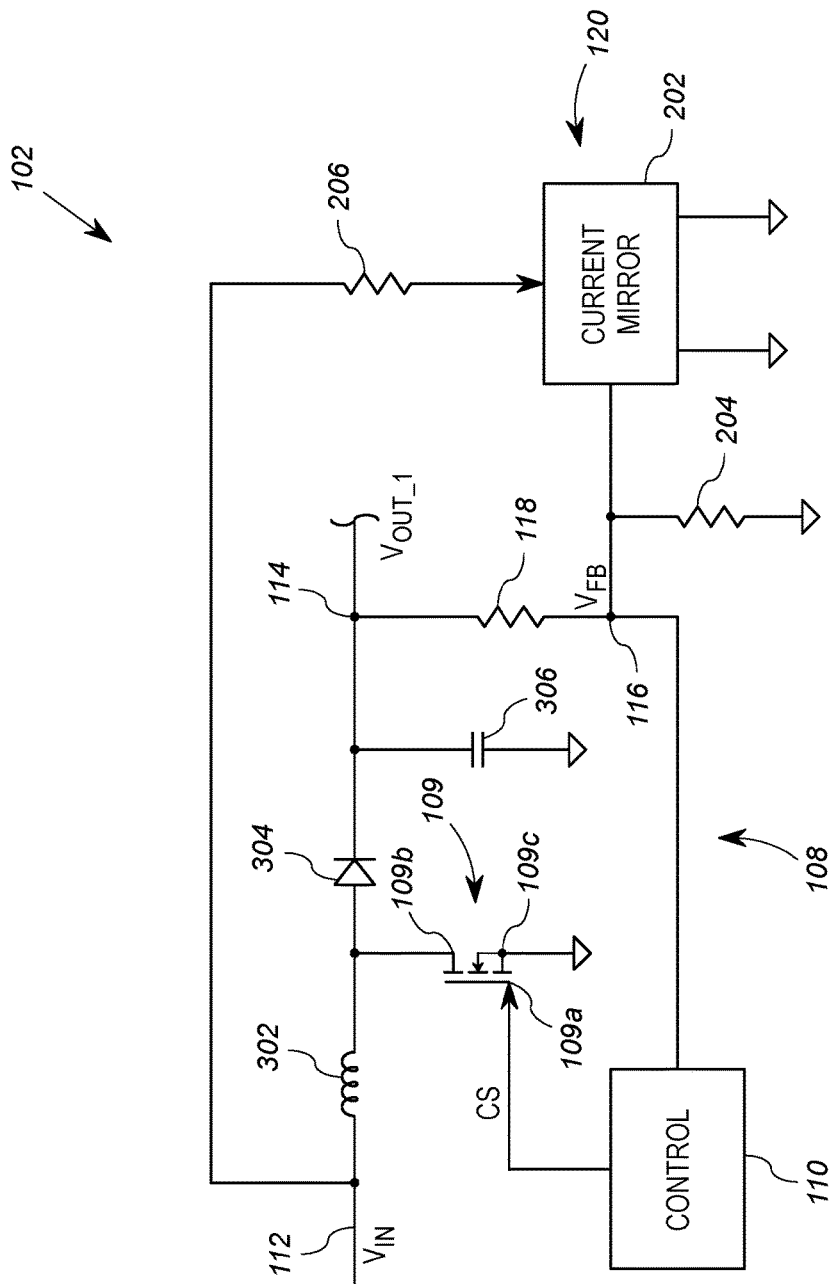
FIG. 3 shows a schematic block diagram of an exemplary embodiment of the first power conversion stage of the power conversion arrangement of FIG. 1.

FIG. 3 shows in further detail an exemplary embodiment of the boost power factor conversion stage 102 that is configured to generation a variable output voltage as function of a variable input voltage, but wherein the range of output voltage is narrower than the range of input voltage. Like reference numbers are used to identify like reference numbers from FIGS. 1 and 2.

As shown in FIG. 3, the input 112 of the first converter stage 102 is also the input to the switching converter 108. The switching converter 108 in this embodiment includes an inductive element 302, a rectifier 304, the semiconductor switch 109, and a capacitor 306. It will be appreciated that the switching converter 108 may further include various over-voltage and/or over-current protection devices and/or start-up circuits, and other common PFC elements.

The semiconductor switch 109, which may suitably be an N-channel MOSFET, includes a control terminal 109a, a first terminal (e.g. drain) 109b, and a second terminal (e.g. source) 109c. The control terminal 109a is operably coupled to receive the control signal from the controller 110. The second terminal 109c is coupled to ground. The inductive element 302, which may suitably be an inductor, is serially connected between the input 112 and the first terminal 109b of the semiconductor switch 109. The inductive element 302 is operably coupled to the input 112 to receive the input voltage $V_{IN}$. The rectifier 304 is serially coupled between the first terminal 109b of the semiconductor switch 109 and the output terminal of the switching converter 108 which is the output 114 of the first power conversion stage 102. The rectifier 304, which may suitably be a diode, is biased to conduct current received from the inductive element 302 to the output 114. The capacitor 306 is coupled between the output 114 and ground.

As shown in FIGS. 1 and 2, the output 114 is coupled to provide the output voltage $V_{OUT\_1}$ to the first impedance 118, which is serially connected between the output 114 and the feedback node 116. The feedback node 116 is operably coupled to provide the feedback voltage $V_{FB}$ to the controller 116. The current mirror 202 is coupled between the feedback node 116 and ground, and is further operably coupled to the first input 112 via the sense impedance 206. As discussed above, the current mirror 202 is configured to draw a current from the feedback node 116 that corresponds to a current generated through the sense impedance 206 by the input voltage $V_{IN}$. The fixed resistor 204 is coupled from the feedback node 116 to ground.

The operation of the first conversion stage 102 is generally set forth above in connection with FIGS. 1 and 2. The additional details of the operation of the inductive element 302, the switch 109, the rectifier 304 and the capacitor 306 as a boost PFC converter would be known to one of ordinary skill in the art.

It will be appreciated that the first conversion stage 102 may be used in circuits other than those shown in FIG. 1. The first power conversion arrangement 102 of FIG. 3 may be used in any situation in which an output voltage may be variable, but should have a range that is less than that of in the input voltage.

Figure 4:
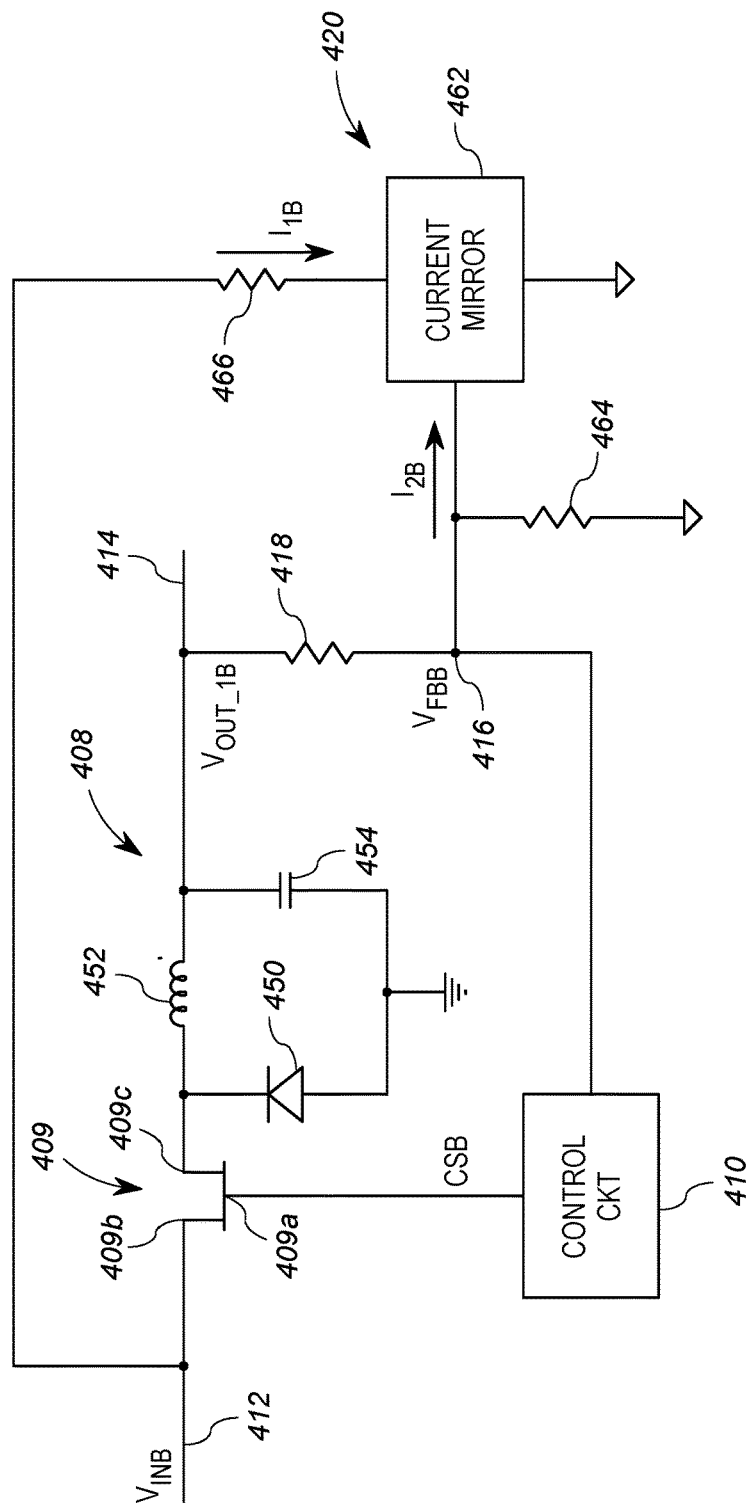
FIG. 4 shows an alternative power conversion stage that incorporates a variable resistance in accordance with some embodiments of the invention.

Similarly, a power conversion stage having a variable output according to the invention may be implemented with a buck PFC circuit, or any other AC/DC or DC/DC converter topology, PFC or not. By way of example, FIG. 4 shows a buck conversion arrangement 400 that implements a variable resistor 420 to generate a variable output voltage that is function of a variable input voltage, but wherein the range of output voltage is narrower than the range of input voltage. The arrangement 400 includes a switching converter 408, a controller 410, an input 412, an output 414, a feedback node 416, a first impedance 418 and a variable resistance 420. In this embodiment, the switching converter 408 is a buck converter circuit, as will be discussed below in further detail.

The input 412 is operably coupled to receive an input voltage $V_{INB}$. The switching converter 408 is configured to generate a first output voltage $V_{OUT\_1B}$ at its output 414 from the input voltage $V_{INB}$. To this end, the switching converter 408 includes a semiconductor switch 409, a rectifier 450, an inductive element 452, a capacitor 454 and a controller 410. The semiconductor switch 409, which may suitably be a MOSFET, includes a control terminal 409a, a first terminal (e.g. drain) 409b, and a second terminal (e.g. source) 409c. The control terminal 409a is operably coupled to receive the control signal from the controller 410. The first terminal 409b is operably coupled to receive the input voltage $V_{INB}$ from the input 412.

The inductive element 452, which may suitably be an inductor, is serially connected between the second terminal 409c of the semiconductor switch 409 and the output 414. The rectifier 450 is serially coupled between the second terminal 409c of the semiconductor switch 409 and ground. The rectifier 450, which may suitably be a diode, is reversed biased from the second terminal 409c to ground. The capacitor 454 is coupled between the output 414 and ground.

As with the embodiment of FIGS. 1 and 3, the variable resistance 420 in this embodiment includes a current mirror 462, a fixed resistor 464, and a sense impedance or sense resistor 466. The current mirror 462 is operably coupled between the feedback node 416 and ground, and is further operably coupled to the input 412 via the sense resistor 466. The current mirror 462 is configured to draw a current $I_{2B}$ from the feedback node 416 that corresponds to a sense current $I_{1B}$ generated through the sense impedance 466 by the input voltage $V_{INB}$. The adjustment resistor 466 in this embodiment is a non-variable resistor coupled between the feedback node 416 and ground. The current mirror 462 may suitably have the same design as the current mirror 202, and operates in the similar manner. Accordingly, similar to the embodiment of FIG. 2, the fixed resistor 464 operates to scale the impact of the $V_{INB}$ on the output voltage $V_{OUT\_1B}$.

The feedback node 416 is the node in which the first impedance 418 connects to the variable resistor 420, and specifically, the fixed resistor 464 and the current mirror 462. The first impedance 418, which in this embodiment is a resistor, is serially coupled from the output 414 to the feedback node 416. Accordingly, the feedback node 416 is the output of a voltage divider formed by the first impedance 418 and the variable resistance 420. The controller 410 is operably coupled to receive the feedback voltage $V_{FBB}$ from the feedback node 416, and is configured to control the switch 409 to drive the output such that the feedback voltage $V_{FBB}$ is driven to a substantially constant, predetermined value.

In the same manner as the embodiments of FIGS. 1 to 3, the variable resistance 420 has a resistance value that varies as a function of the input voltage. Accordingly, it will be appreciated that because the voltage $V_{FBB}$ is constant, a change in the input voltage $V_{INB}$ will change the output voltage $V_{OUT\_1B}$.

In operation, the input 412 receives the input voltage $V_{INB}$, which may suitably be a rectified AC voltage. The elements of the switching converter 408 cooperate in a well-known buck converter operation to generate at the output 414 the output voltage $V_{OUT\_1B}$, based on the input voltage $V_{INB}$ and a control signal CSB provided by the controller 410 to the switch 409. Unlike the boost conversion stage 102 of FIG. 3, the buck switching converter 408 produces an output voltage $V_{OUT\_1B}$ that is lower than the input voltage $V_{INB}$.

In any event, the voltage divider created by the first impedance 418 and the variable resistance 420 generates the feedback voltage $V_{FBB}$ at the feedback node 416. The variable resistor 420 also receives in the input voltage $V_{INB}$. For the reasons discussed above, the variable resistor 420 has a resistance that is a function of the voltage level of $V_{INB}$.

The controller 410 operates to hold $V_{FBB}$ constant. Specifically, the switching converter 408 modulates the duty cycle of its periodic control signal CSB to control the level of the output voltage $V_{OUT\_1B}$. The controller 410, modulates the duty cycle as a function of the feedback voltage $V_{FBB}$. As is known in the art, the controller 410 is configured to control the duty cycle of the control signal CSB to drive the output $V_{OUT\_1B}$ to a voltage that causes the feedback voltage $V_{FBB}$ to be at (or be driven toward) a constant predetermined level.

When $V_{FBB}$ is at the predetermined set point, the output voltage $V_{OUT\_1B}$ depends on the value $R_V$ of the variable resistance 420. Specifically, because the resistance $R_V$ of the variable resistance 420 can change, and because the feedback voltage $V_{FBB}$ and the resistance $R_{1B}$ of the first impedance 418 are constant, the output voltage $V_{OUT\_1B}$ changes as a function of the variable resistance $R_V$.

The arrangement of FIG. 4 thus illustrates how the variable resistance of FIGS. 2 and 3 may readily be implemented in connection with a buck conversion stage. The arrangement of FIG. 4 may also be combined with other conversion stages to provide a constant output voltage power converter.

It will be appreciated that the above described embodiments are merely illustrative, and that those of ordinary skill in the art may readily device their own implementations and modifications that incorporate the principles of the present invention and fall within the spirit and scope thereof. In one modification, one of ordinary skill in the art would appreciate that a variable resistance similar to the variable resistor 120 herein may be employed between the output node (e.g. 114, 414) and the feedback node (e.g. 116, 416) to achieve the results discussed herein.

What is claimed is:

1. A power conversion arrangement, comprising:
a first power conversion stage having a first input configured to receive an input voltage, an output having a first output voltage, a feedback node having a feedback voltage, the feedback node coupled to the output by a first impedance, and a controller operably coupled to receive the feedback voltage configured to drive the output such that the feedback voltage is substantially at a predetermined value, a variable resistance coupled between the feedback node and ground, the variable resistance having a resistance value that varies as a function of the input voltage; and
a second power conversion stage having a second stage input operably coupled to receive the first output voltage, the second power conversion stage configured to generate a second output voltage having a voltage level that is substantially constant independent of a voltage level of the first output voltage.

2. The power conversion arrangement of claim 1, wherein the first power conversion stage includes a boost converter.

3. The power conversion arrangement of claim 2, wherein the second power conversion stage includes a buck converter.

4. The power conversion arrangement of claim 3, wherein the first power conversion stage further comprises: a switched converter circuit operably coupled to receive the input voltage, the switched converter circuit including a semiconductor switch controlled by the controller, the controller operably coupled to receive the feedback voltage, the switched convert circuit configured to provide the first output voltage at the output; a first resistive branch serially coupled between the output and the feedback node; wherein the variable resistance is coupled between the feedback node and ground, the first resistive branch and the variable resistance forming a voltage divider at the feedback node.

5. The power conversion arrangement of claim 4, wherein the variable resistance includes a current mirror coupled between the feedback node and ground, the current mirror further operably coupled to the first input via a sense impedance.

6. The power conversion arrangement of claim 5, wherein the current mirror is further configured to draw a current from the feedback node that corresponds to a current generated through the sense impedance by the input voltage.

7. The power conversion arrangement of claim 6, wherein the variable resistance further includes a fixed resistor coupled between the feedback node and ground in parallel to the current mirror.

8. The power conversion arrangement of claim 6, wherein the current mirror comprises a first FET and a second FET, the first FET having a first gate and coupled between the feedback node and ground, and the second FET having a second gate and coupled between the sense impedance and ground, and wherein the first gate is directly coupled to the second gate.

9. The power conversion arrangement of claim 8, wherein the sense impedance is directly coupled to the second gate and the first gate.

10. The power conversion arrangement of claim 4, further comprising a rectifier circuit couple to provide a rectified AC signal as the input voltage.

11. The power conversion arrangement of claim 10, wherein the rectifier is a half-wave rectifier.

12. A power converter comprising:
a switched converter circuit operably coupled to receive an input voltage, the switched converter circuit including a semiconductor switch controlled by a controller, the controller operably coupled to receive a feedback signal, the switched converter circuit configured to provide an output voltage at an output;

a feedback node having a feedback voltage;

a first resistive branch and a variable resistance serially coupled to form, at least in part, a voltage divider from the output to ground, wherein a divided voltage of the voltage divider defines the feedback voltage, and wherein the variable resistance has a resistance value that changes as a function of the input voltage.

13. The power converter of claim 12, wherein the variable resistance includes a current mirror coupled between the feedback node and the reference voltage, the current mirror further operably coupled to the input voltage via a sense impedance.

14. The power converter of claim 13, wherein the current mirror is further configured to draw a current from the feedback node that corresponds to a current generated through the sense impedance by the input voltage.

15. The power converter of claim 14, wherein the variable resistance further includes a fixed resistor coupled between the feedback node and the reference voltage in parallel to the current mirror.

16. The power converter of claim 14, wherein the current mirror comprises a first FET and a second FET, the first FET having a first gate and coupled between the feedback node and ground, and the second FET having a second gate and coupled between the sense impedance and ground, and wherein the first gate is directly coupled to the second gate.

17. The power converter of claim 16, wherein the sense impedance is directly coupled to the second gate and the first gate.

18. The power converter of claim 16, further comprising a first resistive element coupled between the first FET and ground, and a second resistive element coupled between the second FET and ground, the second resistive element and the first resistive element having substantially identical resistance values.

19. The power converter of claim 18, wherein the switched converter circuit further comprises:

a semiconductor switch including a control terminal, a first terminal, and a second terminal, the control terminal operably coupled to receive a control signal from the controller, the second terminal coupled to a reference voltage;

an input terminal having the input voltage, an inductive element serially connected between the input terminal and the first terminal of the semiconductor switch, the inductive element configured to receive the input voltage;

a rectifier serially coupled between the first terminal and the output terminal, the rectifier biased to conduct current received from the inductive element to the output;

a capacitor coupled between the output terminal and the reference voltage.

20. The power converter of claim 18, wherein the rectifier comprises a diode, and wherein the inductive element comprises and inductor.

* * * * *